US006876688B1

(12) United States Patent
Hayakawa et al.

(10) Patent No.: US 6,876,688 B1
(45) Date of Patent: Apr. 5, 2005

(54) SEMICONDUCTOR LASER AND METHOD OF MANUFACTURING THE SAME

(75) Inventors: Toshiro Hayakawa, Kanagawa-ken (JP); Toshiaki Fukunaga, Kanagawa-ken (JP); Mitsugu Wada, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/315,068

(22) Filed: May 20, 1999

(30) Foreign Application Priority Data

May 21, 1998 (JP) .......................................... 10-139623

(51) Int. Cl.$^7$ ............................................... H01S 5/00
(52) U.S. Cl. ............................ 372/46; 372/43; 372/44; 372/96
(58) Field of Search ............................. 372/46, 96, 45

(56) References Cited

U.S. PATENT DOCUMENTS

| | | | | |
|---|---|---|---|---|
| 4,567,060 A | | 1/1986 | Hayakawa et al. ............ 427/87 |
| 4,728,628 A | | 3/1988 | Fiddyment et al. .......... 437/225 |
| 5,292,685 A | * | 3/1994 | Inoguchi et al. .............. 438/32 |
| 5,574,743 A | * | 11/1996 | van der Poel et al. ......... 372/45 |
| 5,892,785 A | * | 4/1999 | Nagai .......................... 257/192 |
| 5,920,586 A | * | 7/1999 | Nagai .......................... 372/45 |
| 5,982,804 A | * | 11/1999 | Chen et al. ..................... 372/96 |
| 6,127,691 A | * | 10/2000 | Fukunaga et al. ............. 257/17 |
| 6,181,721 B1 | * | 1/2001 | Geels et al. ................. 257/191 |
| 6,195,373 B1 | * | 2/2001 | Fukunaga ...................... 372/45 |
| 2002/0044584 A1 | * | 4/2002 | Fukunaga ...................... 372/46 |

FOREIGN PATENT DOCUMENTS

JP  7-74425  3/1995 ............. H01S/3/18

OTHER PUBLICATIONS

S. O'Brien et al, High power wide aperture AlGaAs–based lasers at 870nm, Jan. 22, 1998, vol. 34, No. 2, p. 184–186.
T. Fukunaga et al, Highly Reliable Operation of High–Power In GaAsP/InGaP/AlGaAs 0.8 μm Seperate Confinement Heterostructure Lasers, Sep. 15, 1995, vol. 34, No. 9B, p. L1175–L117.
J.K. Wade et al, 6.1 W continuous wave front–facet power from Al–free active–region μ=805 nm) diode lasers, Jan. 5, 1998, vol., 72, No. 1, p. 4–6.
M.A. Emanuel et al, High–Power Laser Diode at Various Wavelengths, 1997, vol. 3001, p. 2–6.
Low–threshold room–temperature cw operation of (AlGaAs)m(GaAs)n superlattice quantum well lasers emitting at—680nm, Sep. 7, 1987, vol. 57, p. 707—709.
Milind R. Gokhale, et al.; "High–Power High–Efficiency 0.98–μm Wavelength InGaAs–(In)GaAs(P)–InGaP Broadened Waveguide Lasers Grown by Gas–Source Molecular Beam Epitaxy" vol. 33; No. 12; Dec. 1997; pp. 2266–2276.
Electronics Letters; vol. 28; No. 16; pp. 1531–1532; Jul. 1992.
Wade J K et al; "6.1 W Continuous Wave Front–Facet Power From Al–Free Actice–Region (LAMBDA=805 NM) Diode Lasers"; vol. 72 No. 1; Jan. 5, 1998 pp. 4–6; XP000737351.

(Continued)

*Primary Examiner*—Minsun Oh Harvey
*Assistant Examiner*—Dung Nguyen
(74) *Attorney, Agent, or Firm*—Sughrue Mion, PLLC

(57) ABSTRACT

A semiconductor laser has an active region which includes at least a quantum well layer and upper and lower optical waveguide layers and is of $In_xGa_{1-x}As_yP_{1-y}$ ($0 \leq x \leq 1$, $0 \leq y \leq 1$). Upper and lower AlGaAs cladding layers are formed on opposite sides of the active region. At least one of the optical waveguide layers is not smaller than 0.25 μm in thickness, and a part of the upper cladding layer on the upper optical waveguide layer is selectively removed up to the interface of the upper cladding layer and the upper optical waveguide layer.

16 Claims, 11 Drawing Sheets

OTHER PUBLICATIONS

Unger P et al; "Junction–Side Up Operation of (AL) GAINP Lasers With Very Low Threshold Currents"; vol. 28, No. 16; Jul. 30, 1992; pp. 1531–1532; XP000309705.

Erber G et al; "A Study Of Structures With Al–Free QWs IN AlGaAs Waveguides For Laser Diode Emitting At 800 NM" vol 1; pp. 46–47; XP002148474.

Iwai N et al.; "Low Threshold Current 1.3$\mu$M InAsP QW ACIS Lasers" vol. 34; No. 9; Apr. 30, 1998; pp. 890–891; XP000799146.

Fukunaga T et al; "Highly Reliable Operations of High–Power InGaAsP/InGaP/AlGaAs 0.8 $\mu$M Separate Confinement Heterostructure Lasers" vol. 34; No. 9B; Sep. 15, 1995; XP000702502.

* cited by examiner

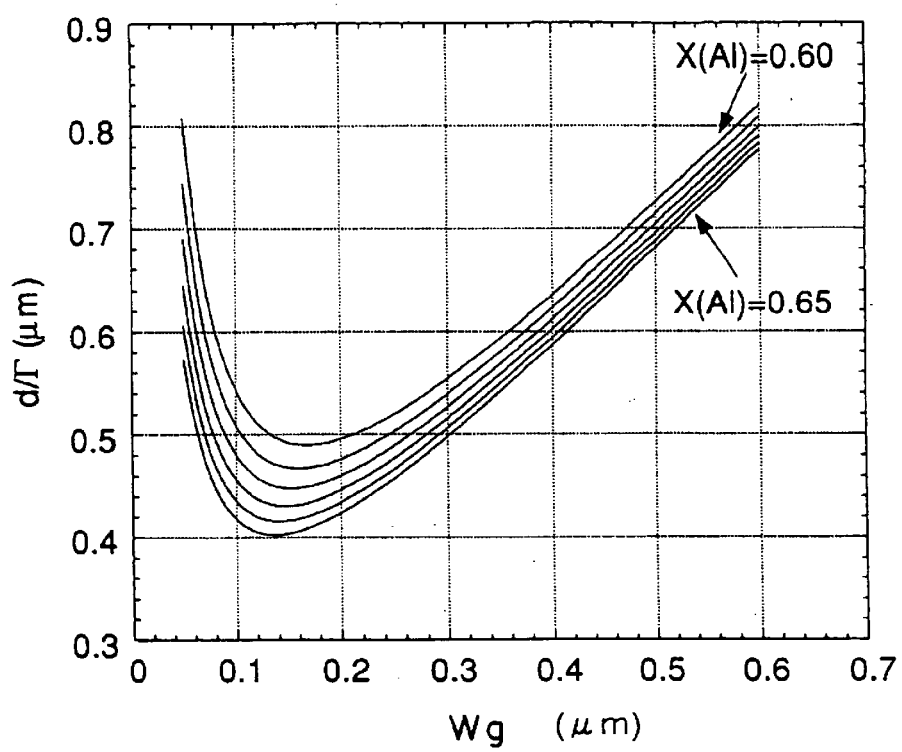
F I G. 4
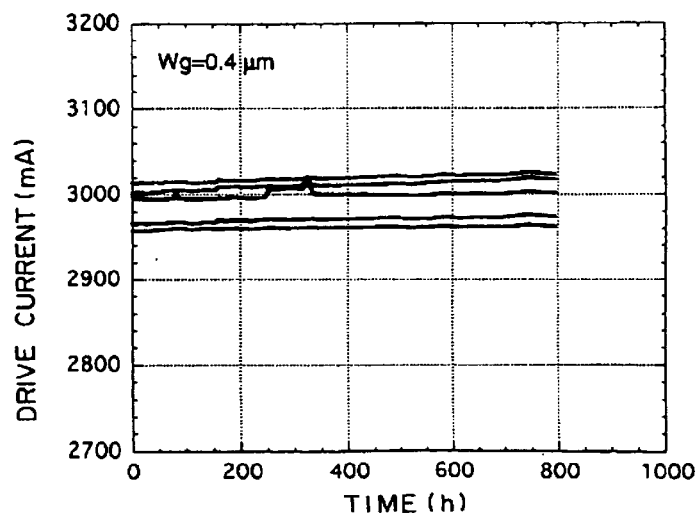
F I G. 5

F I G .14
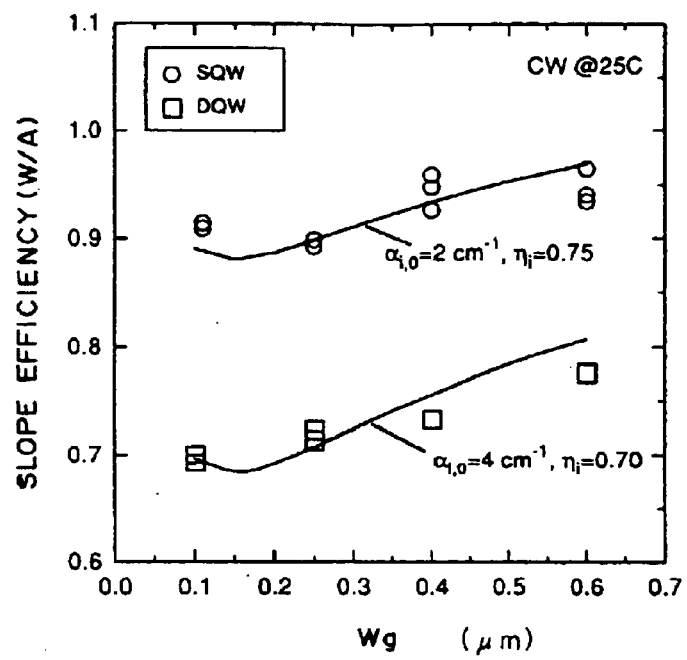
F I G .15
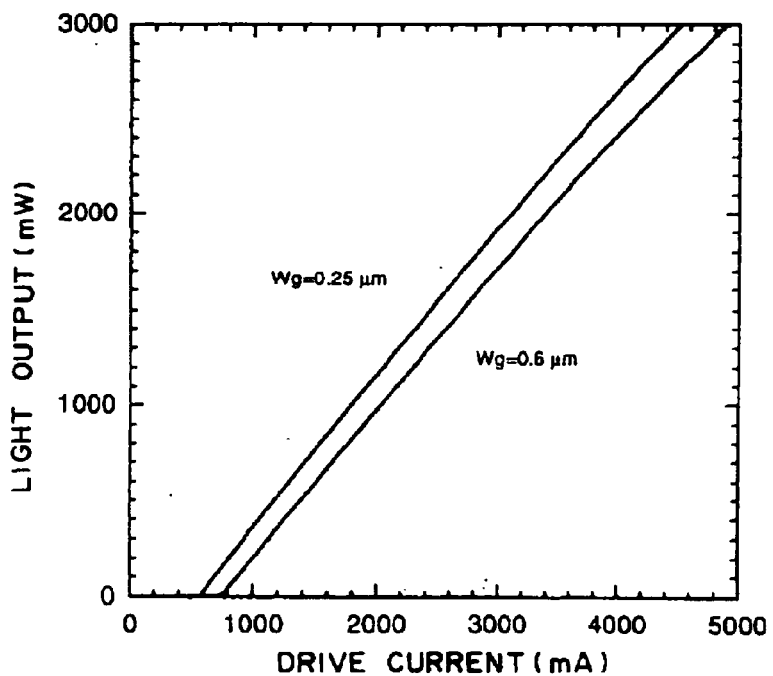

SEMICONDUCTOR LASER AND METHOD OF MANUFACTURING THE SAME

BACKGROUND OF THE INVENTION

1. Field of the Invention

This invention relates to a semiconductor laser, and more particularly to a semiconductor laser having an active region which includes at least a quantum well layer and an optical waveguide layer and is of $In_xGa_{1-x}As_yP_{1-y}$ ($0 \leq x \leq 1$, $0 \leq y \leq 1$). This invention further relates to a method of manufacturing such a semiconductor laser.

2. Description of the Related Art

A semiconductor laser has come to be used in wider and wider fields. Especially a semiconductor laser which has an GaAs substrate and oscillates in 0.7 to 1.1 μm band has come to be used, as its output power increases, not only for an optical disc and a laser printer but also for a light source for pumping a solid state laser, a fiber amplifier and a fiber laser, a primary light source for generating a second harmonic, a light source for thermally recording an image on a heat-sensitive material, for instance, in printing, a light source for medical use, a light source for laser machining and laser soldering, and the like.

In these applications, it is extremely important that the semiconductor laser can output high power. In a single mode laser which is narrow in width (not larger than about 5 μm), those which are 500 mW or more in the maximum light output and 150 mW or more in the practical light output have been reported as, for instance, a light source for pumping a fiber amplifier oscillating, for instance, at 0.98 μm or 1.02 μm. Further it has been reported that, in multiple-mode lasers which are about 50 μm or more in stripe width, the catastrophic optical damage (COD) when the oscillation wavelength is, for instance, 0.87 μm is 11.3W in the case of an element which is 100 μm in stripe width and is 16.5W in the case of an element which is 200 μm in stripe width. See "Electronics Letters", vol. 34, No. 2, P. 184 (1998), (S. O'Brien, H. Zhao and R. J. Lang).

These inventors have proposed a semiconductor laser in which catastrophic failure due to oxidization of Al is prevented by freeing the vicinity of the light emission region (a quantum well layer and an optical waveguide layer which is adjacent to the quantum well layer and forms a barrier) from Al and at the same time, an AlGaAs layer is employed as a cladding layer in order to prevent deterioration in temperature characteristics due to leakage of electrons from the active region. With this arrangement, the semiconductor laser can operate at high output power. See "Japanese Journal of Applied Physics", Vol. 34, No. 9B, p. L1175 (1995), (T. Fukunaga, M. Wada, H. Asano and T. Hauakawa). This will be referred to as "reference 1", hereinbelow.

In the semiconductor laser which these inventors have proposed, the thickness of each InGaP cladding layer is 0.1 μm and the optical confinement factor (Γ) to the active layer quantum well for a laser beam is relatively large. Accordingly, when a device which was 50 μm in stripe width was aged under 500 mw at 50° C. in an APC (automatic power control) mode, deterioration rate of the drive current was relatively large and was $5 \times 10^{-5} h^{-1}$ in median. Further when a device which was 200 μm in stripe width was aged under 2000 mW at 25° C. in an APC mode, deterioration rate of the drive current was also $5 \times 10^{-5} h^{-1}$ in median.

Such high output power semiconductor lasers having a relatively wide stripe comes to stop oscillating when the drive current increases by about 5%. Accordingly the service life of the latter semiconductor laser is estimated at about 1000 hours in median, which is practically insufficient. Further since being of a gain waveguide type, the conventional semiconductor lasers are disadvantageous in that fundamental oscillation characteristics such as the current versus light output characteristics become unstable due to fluctuation in transverse mode.

Further there has been known a semiconductor laser in which the output power is increased by employing Al-free material different from that disclosed in "reference 1" and at the same time reducing the optical confinement factor (Γ) to the active layer quantum well for a laser beam by increasing the thickness of the optical waveguide layer. See "Appl. Phys. Lett.", Vol. 72, No. 1, P. 4, (J. K. Wade, L. J. Mawst, D. Botez. R. F. Nabiev, M. Jansen and L. A. Morris) (reference 2) and "SPIE Proceeding", Vol. 3001, p. 2 (1997), (M. A. Emanuel, J. A. Skidnore and R. J. Beach) (reference 3).

However, as disclosed in "reference 1", especially in the wavelength range not longer than 850 nm, temperature characteristics deteriorate due to leakage of electrons into a p-type cladding layer when the cladding layer is formed of a material free from Al. This is because electron barrier cannot be sufficient even if InGaP is used which is the largest in forbidden band width in materials which can be lattice-matched with the GaAs substrate.

Further when producing such a refractive index waveguide type element, it is difficult to stop etching at the interface of an InGaP cladding layer and an InGaAsP optical waveguide layer since these layers resemble each other in chemical properties.

Further there has been reported an element in which the cladding layer is formed of InGaAlP for the purpose of suppressing deterioration in temperature characteristics due to leakage of electrons into the p-type cladding layer, as disclosed in "reference 2". However in "reference 2", only the gain waveguide type is mentioned and optimization for the refractive index waveguide type is not mentioned.

Further, the p-type InGaAlP is generally disadvantageous as compared with AlGaAs in that it is high in electric resistance and thermal resistance. Reliability when such a material is used has not been discussed. When the active layer is exposed to atmosphere on a GaAs substrate during production of a refractive index waveguide type element, crystallizability on the surface thereof deteriorates and remarkable deterioration of the exposed part of the crystal interface due to non-emission recombination of carriers is generated.

Accordingly, a method in which etching is carried out up to a portion immediately above the active layer has been generally employed. FIG. 2 shows a ridge waveguide type laser having an n-side electrode 20, an n-GaAs substrate 11, an n-GaAs buffer layer 12, an n-AlGaAs cladding layer 13, an undoped SCH active layer 14, a p-AlGaAs cladding layer 16, a p-GaAs capping layer 17, a $SiO_2$ insulating film 18, and a p-side electrode 19. In this case, etching is carried out so that the upper cladding layer 16 is left in a small thickness 15 (about 0.1 to 0.3 μm) by controlling the etching time.

However such etching time control is disadvantageous in the reproducibility deteriorates due to fluctuation in etching conditions and thickness of the cladding layer from wafer to wafer. In order to overcome this problem, there has been proposed a structure in which an etching stop layer 26 as shown in FIG. 3. The structure in FIG. 3 has an n-side electrode 31, an n-GaAs substrate 21, an n-GaAs buffer layer 22, an n-AlGaAs cladding layer 23, an undoped SCH active layer 24, a p-AlGaAs cladding layer 25, a p-InGaP etching stop layer 26, a p-AlGaAs cladding layer 25, a p-GaAs capping layer 28, a $SiO_2$ insulating film 29, and a p-side electrode 30. See U.S. Pat. No. 4,567,060 (reference 4).

For example, in the case where an AlGaAs cladding layer 23/25 and an InGaAsP active region 24 are combined, by inserting an InGaP etching stop layer 26 (about 1 to 5 nm in thickness), which is lattice-matched with the GaAs substrate 21, into the upper cladding layer 27 as shown in FIG. 3, it becomes feasible to stop etching of the AlGaAs 27 at the InGaP etching stop layer 26 in various etching methods.

However an InGaP layer inserted into a p-type AlGaAs cladding layer sometimes deteriorates crystallization, which results in increase in electric In) resistance and/or built-in voltage. This is supposed because As on the surface of the AlGaAs is substituted by P to form AlGaAsp on the crystal interface of AlGaAs and InGaP at the beginning of crystal growth.

SUMMARY OF THE INVENTION

In view of the foregoing observations and description, the primary object of the present invention is to provide a high power semiconductor laser in which the service-life elongating effect of using an Al-free active layer material is enhanced and the long-term reliability is improved.

Another object of the present invention is to provide a method of manufacturing such a high power semiconductor laser.

The semiconductor laser in accordance with the present invention comprises an active region which includes at least a quantum well layer and upper and lower optical waveguide layers and is of $In_xGa_{1-x}As_yP_{1-y}(0 \leq x \leq 1, 0 \leq y \leq 1)$ free from Al and upper and lower cladding layers formed of AlGaAs, and is characterized in that at least one of the optical waveguide layers is not smaller than 0.25 µm in thickness, and a part of the upper cladding layer on the upper optical waveguide layer is selectively removed up to the interface of the upper cladding layer and the upper optical waveguide layer.

The method of manufacturing a semiconductor laser in accordance with the present invention is for manufacturing the semiconductor laser of the present invention, and is characterized by the steps of forming at least one of the optical waveguide layers in thickness not smaller than 0.25 µm, forming the upper cladding layer of AlGaAs on the upper optical waveguide layer and selectively removing by etching a part of the upper cladding layer on the upper optical waveguide layer up to the interface of the upper cladding layer and the upper optical waveguide layer.

In the semiconductor laser of the present invention with arrangement described above, the light density (Γ/d) in the quantum well portion is reduced by virtue of the optical waveguide layer not smaller than 0.25 µm in thickness, whereby internal loss is reduced and the deterioration rate in the drive current during APC aging which increases in proportion to the fourth or more power of the light density is reduced.

The semiconductor laser of the present invention is a refractive index waveguide type element since a part of the upper cladding layer on the upper optical waveguide layer is selectively removed up to the interface of the upper cladding layer and the upper optical waveguide layer.

When such a refractive index waveguide type element structure, the upper cladding layer is removed by etching inside or outside the stripe. When removing by etching a part of the upper cladding layer, conventionally, there is employed a method in which a part of the upper cladding layer is left unetched by providing an etching stop layer which differs from the upper cladding layer in composition and/or component atoms and is etched at a rate greatly smaller than the upper cladding layer ("reference 4"), or a method in which a part of the upper cladding layer is left unetched by controlling the etching time (See "reference 5": "Applied Physics Letters", Vol. 51, Bo. 10, p. 707 (1987), (T. Hayakawa, T. Suyama, K. Takahasi, M. Kondo, S. Yamamoto, and T. Hijikata)).

To the contrary, in accordance with the method of the present invention, the upper cladding layer is removed up to the optical waveguide layer having an increased thickness. By using an organic etching solution such as of sulfuric acid or citric acid, etching can be stopped at the optical waveguide layer. By stopping etching without use of an etching stop layer which adversely affects properties of the elements, the refractive index waveguide structure can be produced with good reproducibility, whereby fundamental oscillation characteristics can be stabilized.

Conventionally since the optical waveguide layer is small in thickness, i.e., about 0.1 µm, the cladding layer is left in a thickness of 0.1 to 0.2 µm in order to suppress deterioration in crystallization without deteriorating the quality of the active layer. However, when the thickness of the optical waveguide layer is not smaller than 0.25 µm, deterioration in crystallization does not occur even if the cladding layer is removed to the optical waveguide layer.

Further in the method of the present invention, since the distance between the quantum well in the active layer and the surface of the optical waveguide layer at the part where the cladding layer is removed is increased, damage to the active layer during formation of the refractive index waveguide structure can be suppressed.

As can be understood from the description above, the service-life elongating effect of using an Al-free active layer material can be enhanced and the long-term reliability is greatly improved in accordance with the present invention. Especially, since the semiconductor laser of the present invention has high quality properties as a refractive index waveguide type laser and, at the same time, is very small in variation of properties with time, it can improve system reliability when used as a light source for the field of image forming where noise and/or change in intensity and/or shape of the beam give rise to a problem.

As application to the field of image forming, the semiconductor laser of the present invention can be applied, for instance, to a printing system where a a semiconductor laser pumped solid state laser is employed, or to a visible or ultraviolet light source for a printer or an image scanner where a semiconductor laser pumped solid state laser is employed in combination with a SHG. In the field of a printer using heat-sensitive recording material where a semiconductor laser beam is used as a writing light beam, several to about one hundred high power semiconductor lasers are used in one system, and accordingly, the semiconductor lasers of the present invention greatly contribute to improvement of system reliability.

Further in the semiconductor laser of the present invention, increase of the thickness of the optical waveguide layer reduces trailing of evanescent light oozing into the cladding layer and accordingly, the upper cladding layer can be reduced in thickness without adverse influence of absorption of the capping layer. Accordingly, the thickness of the upper cladding layer, which conventionally should be not smaller than 1.5 µm, may be reduced to not larger than 1 µm. When the upper cladding layer is of such a small thickness, unevenness after etching which the refractive index waveguide structure inherently has can be small, which facilitates the subsequent lithography process and improves the accuracy of the lithography process. Further since the irregularity on the surface of a finished device is reduced, uniform wax wetting is obtained during chip bonding, which improves heat dissipation properties.

BRIEF DESCRIPTION OF THE DRAWINGS

FIG. 4 is a view showing the dependency on the thickness of the optical waveguide layer of d/Γ which is a value proportional to the reciprocal of the light density in the quantum well, FIG. 5 is a view showing change with time of the drive current for a ridge waveguide type semiconductor laser in accordance with the present invention where the optical waveguide layer is 0.4 µm in thickness, FIG. 14 is a view showing measured values and calculated values of dependency on the thickness of the optical waveguide layer of the slope efficiency of a single quantum well semiconductor laser and a double quantum well semiconductor laser, FIG. 15 is a view showing the current versus light output characteristics of a ridge waveguide type semiconductor laser in accordance with the present invention.

DESCRIPTION OF THE PREFERRED EMBODIMENTS

Figure 1:
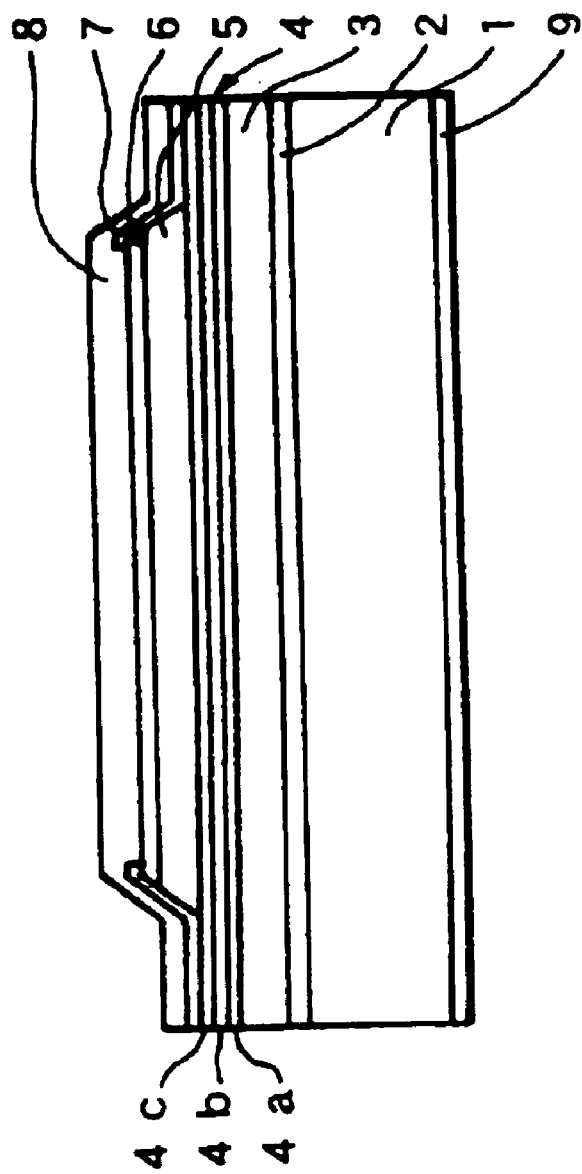
FIG. 1 is a schematic view showing the layer arrangement of a ridge waveguide type semiconductor laser in accordance with a first embodiment of the present invention.

In FIG. 1, a semiconductor laser in accordance with a first embodiment of the present invention comprises an n-GaAs buffer layer 2 (doped with $1 \times 10^{18}$ cm$^{-3}$ Si, 0.5 µm thick), an n-Al$_{0.63}$Ga$_{0.37}$As lower cladding layer 3 (doped with $1 \times 10^{18}$ cm$^{-3}$ Si, 1 µm thick), an undoped SCH active layer 4, a p-Al$_{0.63}$Ga$_{0.37}$As upper cladding layer 5 (doped with $1 \times 10^{18}$ cm$^{-3}$ Zn, 0.3 µm thick), a p-GaAs capping layer 6 (doped with $2 \times 10^{19}$ cm$^{-3}$ Zn, 0.3 µm thick), a SiO$_2$ insulating film 7 to and a p-side electrode 8 formed one on another on one side of an n-Gas substrate 1 (doped with $2 \times 10^{18}$ cm$^{-3}$ Si) and an n-side electrode 9 formed on the other side of the substrate 1.

The undoped SCH active layer 4 comprises an In$_{0.48}$Ga$_{0.52}$P lower optical waveguide layer 4a (undoped, 0.4 µm in thickness Wg), an In$_{0.13}$Ga$_{0.87As0.75}$P$_{0.25}$ quantum well layer 4b (undoped, 10 nm thick) and an In$_{0.48}$Ga$_{0.52}$P upper optical waveguide layer 4c (undoped, 0.4 µm in thickness Wg).

A method manufacturing this semiconductor laser will be described, hereinbelow. An n-GaAs buffer layer 2, an n-Al$_{0.63}$Ga$_{0.37}$As lower cladding layer 3, an undoped SCH active layer 4, a p-Al$_{0.63}$Ga$_{0.37}$As upper cladding layer 5 and a p-GaAs capping layer 6 are first formed one on another in this order on one side of an n-GaAs substrate 1 by low-pressure MOCVD.

Then a mesa stripe structure which is 200 µm in bottom width is formed by photolithography and chemical etching by use of a 20:1:1 mixture of H$_2$SO$_4$, H$_2$O$_2$ and H$_2$O. At this time, the p-Al$_{0.63}$Ga$_{0.37}$As upper cladding layer 5 is etched at a rate 20-th or more as large as that at which the In$_{0.48}$Ga$_{0.52}$P upper optical waveguide layer 4c is etched. By virtue of this fact, the mesa etching can be stopped just above the In$_{0.48}$Ga$_{0.52}$P upper optical waveguide layer 4c with good reproducibility.

Thereafter, a SiO$_2$ insulating film 7 is formed by plasma CVD, and a part of the SiO$_2$ insulating film 7 on the upper surface of the mesa in a region within 1 to 5 µm from opposite edges of the mesa is etched and removed by photolithography and etching by use of dilute HF.

Then a p-side electrode 8 (Ti/Pt/Au) is formed by deposition and heat treatment, and the bottom surface of the GaAs substrate 1 is polished to thin the GaAs substrate 1 to about 100 to 150 µm. Finally an n-side electrode 9 (AuGe/Ni/Au) is formed by deposition and heat treatment.

A laser bar which is 1.5 mm in resonator length and about 1.5 cm in length is cut out from the wafer by scribe with a diamond needle and cleavage, and the light radiating end face and the back end face are applied with optical coating films so that their reflectances are 20% and 95%, respectively. Finally the laser bar is cut into a plurality of laser chips by scribe with a diamond needle and cleavage. Each laser chip is fixed to a copper block by soldering the p-side electrode to the copper block by In solder.

The semiconductor laser produced in this manner oscillates at about 809 nm by a threshold current of 660 to 700 mA and can operate at a high output power of not lower than 2W. FIG. 5 shows change with time of the drive current for this laser when the laser is driven under 2W at 25° C. in an APC mode. As can be seen from FIG. 5, the laser operates very stably.

In order to prove the effect of the present id invention, detailed comparison experiments were carried out. The result is as follows.

Figure 6:
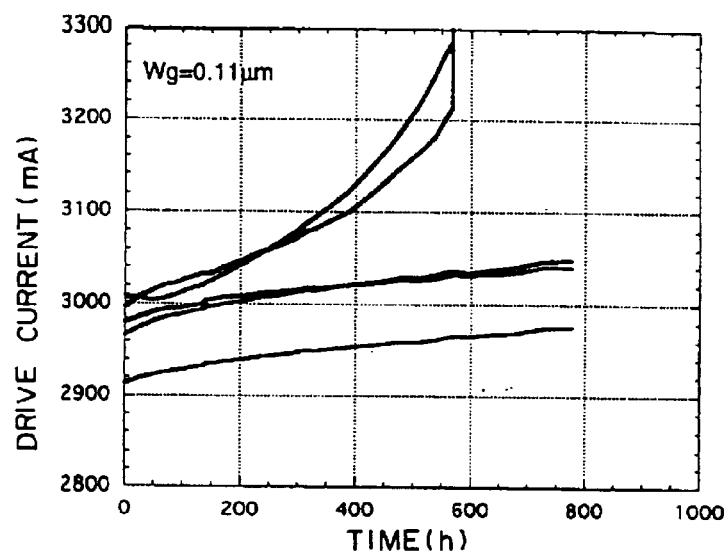
FIG. 6 is a view showing change with time of the drive current for a conventional ridge waveguide type semiconductor laser.
Figure 7:
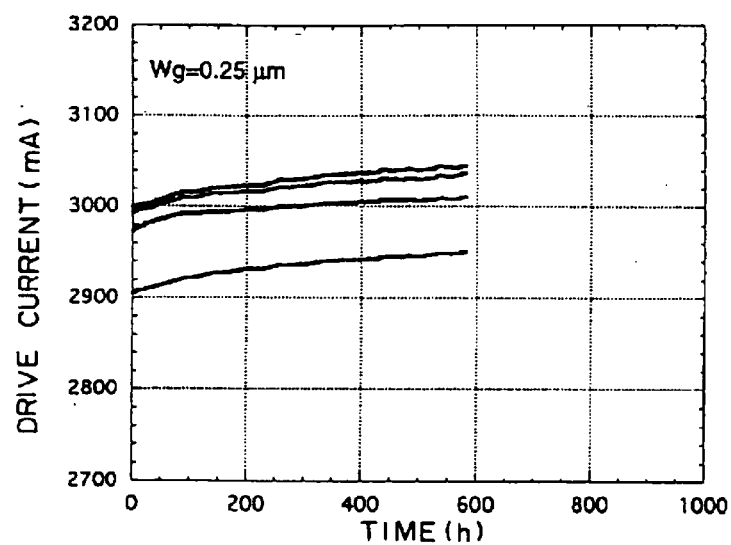
FIG. 7 is a view showing change with time of the drive current for a ridge waveguide type semiconductor laser in accordance with the present invention where the optical waveguide layer is 0.25 µm in thickness.
Figure 8:
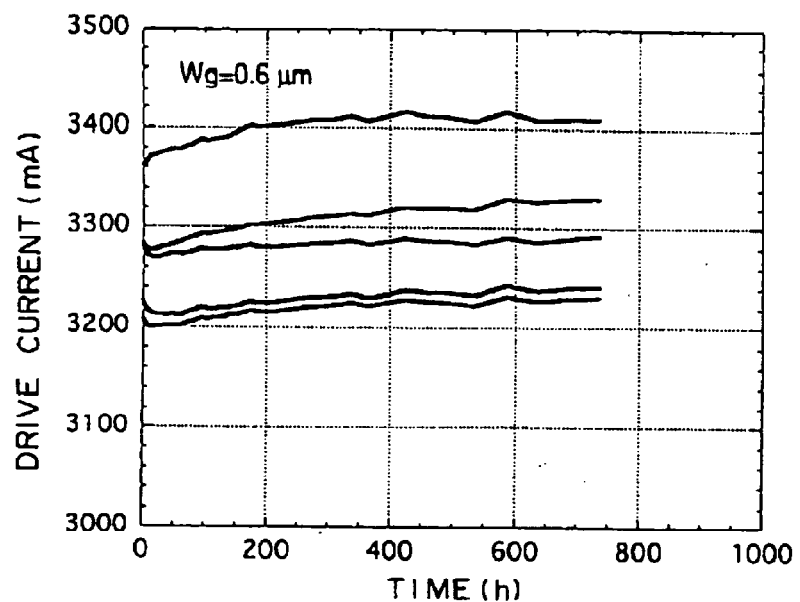
FIG. 8 is a view showing change with time of the drive current for a ridge waveguide type semiconductor laser in accordance with the present invention where the optical waveguide layer is 0.6 µm in thickness.

In a first experiment, comparison semiconductor laser elements which were the same as the semiconductor laser of the first embodiment except that the thickness Wg of the InGaP optical waveguide guide layer differed from that of the first embodiment were produced and their reliability was evaluated. FIGS. 6 to 8 show change with time of the drive current for the comparison lasers, which were 0.11 μm, 0.25 μm and an 0.6 μm in thickness Wg of the optical waveguide guide layer respectively, when the lasers were driven under 2w at 25° C. in an APC mode. As can be seen from FIGS. 6 to 8, when the thickness Wg of the optical waveguide guide layer was smaller than 0.25 μm, deterioration of the drive current was large (FIG. 6), while when the thickness Wg of the optical waveguide guide layer was not smaller than 0.25 μm, deterioration of the drive current was relatively small and the lasers operated stably (FIGS. 7 and 8).

Figure 9:
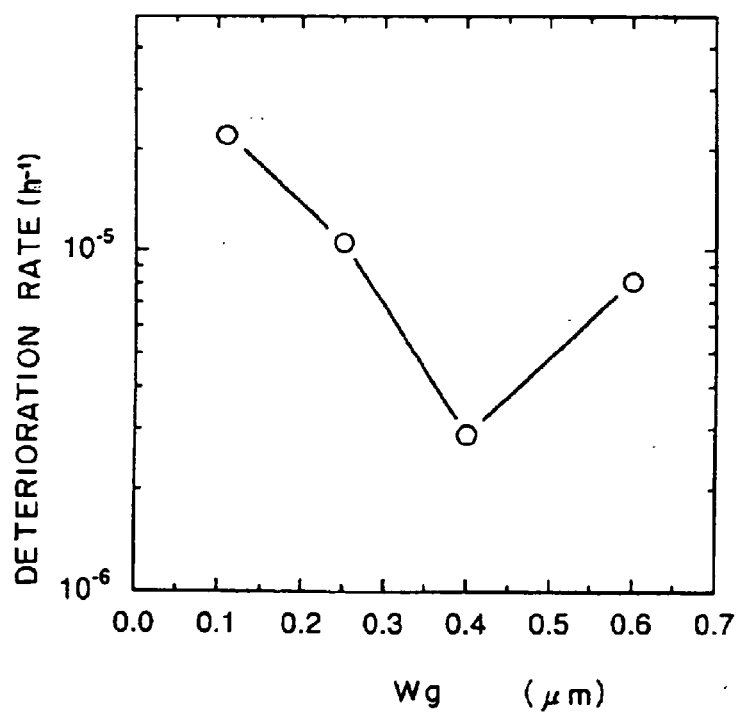
FIG. 9 is a view showing the dependency on the thickness of the optical waveguide layer of the drive current deterioration rate in a ridge waveguide type semiconductor laser.

FIG. 9 shows the relation between the deterioration rate of the drive current (increase of drive current/drive current/time) in median and the thickness Wg of the optical waveguide layer in a stabilized state after the lasers are operated for 200 hours. As can be seen from FIG. 9, the deterioration rate of the drive current is very low.

FIG. 4 shows calculated values of the relation between d/Γ which is a value proportional to the reciprocal of the light density in the quantum well of the active is layer of the structure in accordance with the present invention (d: thickness of the quantum well in μm, Γ: optical confinement factor to the active layer quantum well for a laser beam) and the thickness Wg of the optical waveguide layer. As can be seen from FIG. 4, when the thickness Wg of the optical waveguide layer was in the range of not smaller than 0.25 μm, the light density in the quantum well decreased monotonically with increase of the thickness Wg of the optical waveguide layer, which proved improvement in reliability.

Figure 2:
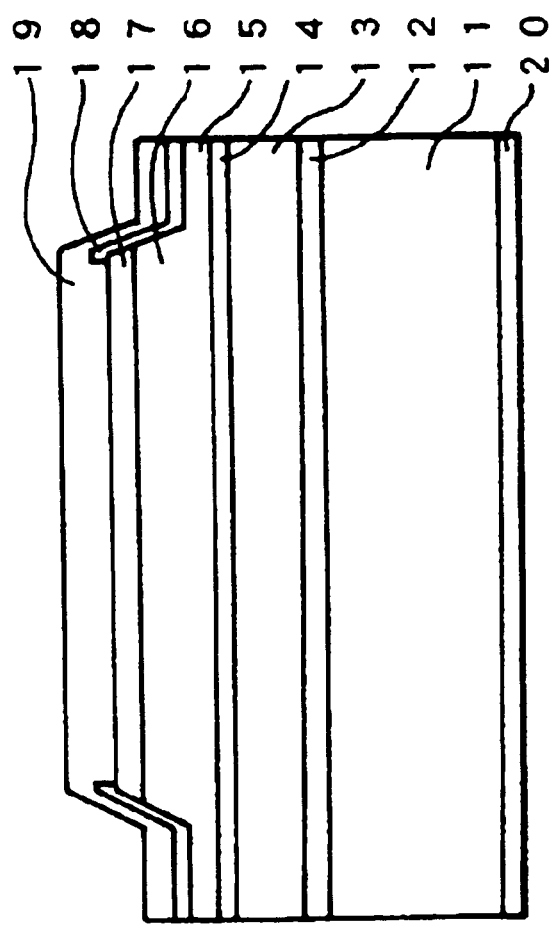
FIG. 2 is a schematic view showing the layer arrangement of an example of a conventional ridge waveguide type semiconductor laser.
Figure 3:
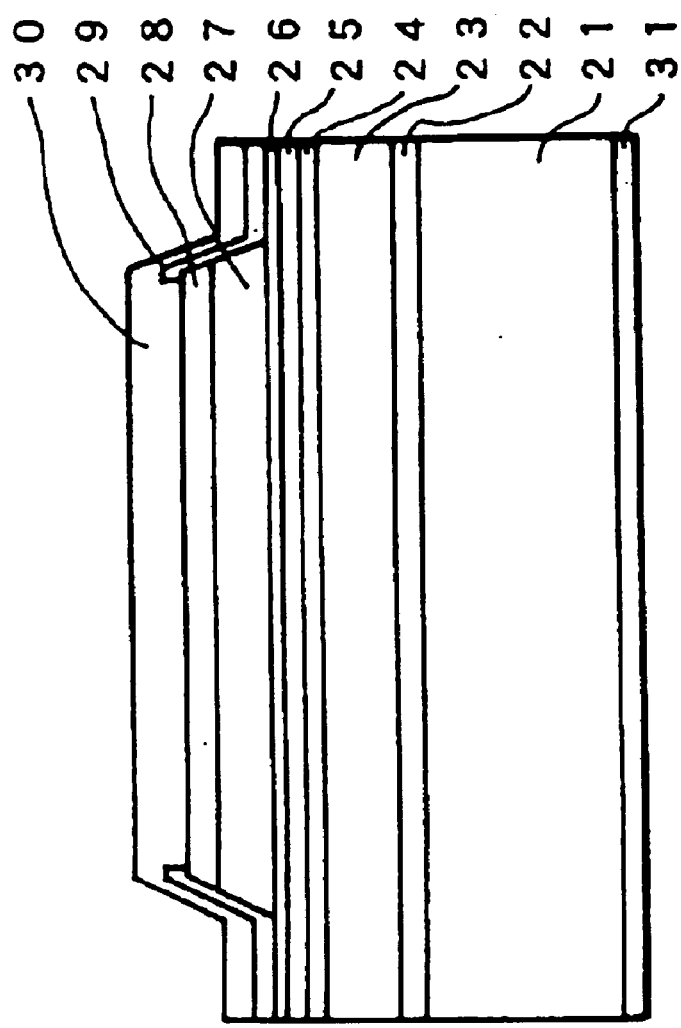
FIG. 3 is a schematic view showing the layer arrangement of another example of a conventional ridge waveguide type semiconductor laser.

When the thickness Wg was 0.6 μm, the deterioration rate was larger than when the thickness Wg was 0.4 μm due to increase of the drive current by about 10%. Further when the thickness Wg was not smaller than 0.25 μm, an excellent reliability was obtained, which proved that reliability was not deteriorated even if an insulated film such as $SiO_2$ was formed in contact with the optical waveguide layer without intervening therebetween an upper cladding layer left there in a small thickness as a protective layer as in the conventional semiconductor lasers shown in FIGS. 2 and 3. Further as shown in FIG. 15, current versus light out characteristics without kink could be obtained up to a high output range and both the far-field image and the near-field image were stable.

Figure 10:
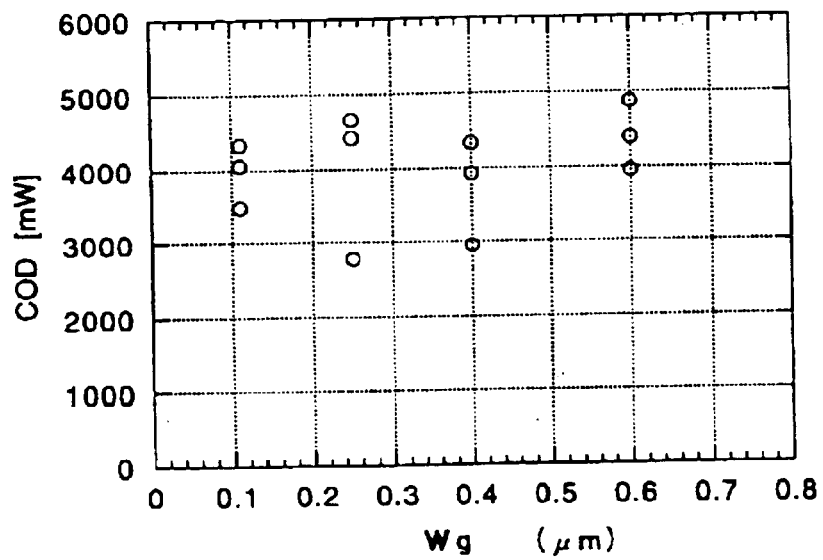
FIG. 10 is a view showing the dependency on the thickness of the optical waveguide layer of the catastrophic optical damage of a ridge waveguide type semiconductor laser.

In a second experiment, the catastrophic optical damages of the aforesaid laser elements were measured. As shown in FIG. 10, the catastrophic optical damage hardly changed with change of the thickness Wg of the optical waveguide layer. This proves that with the arrangement of the present invention, the catastrophic optical damage does not increase with increase of the thickness Wg of the optical waveguide layer as in the example disclosed in "reference 2", that is, the catastrophic optical damage is independent from the light density in the active layer.

In a third experiment, three kinds of laser elements which were the same as the conventional element shown in FIG. 6 in structure, were 0.11 μm in thickness Wg of the optical waveguide layer and were respectively 11%, 20% and 30% in reflectance $R_f$ of the light radiating end face were prepared and compared.

Figure 11:
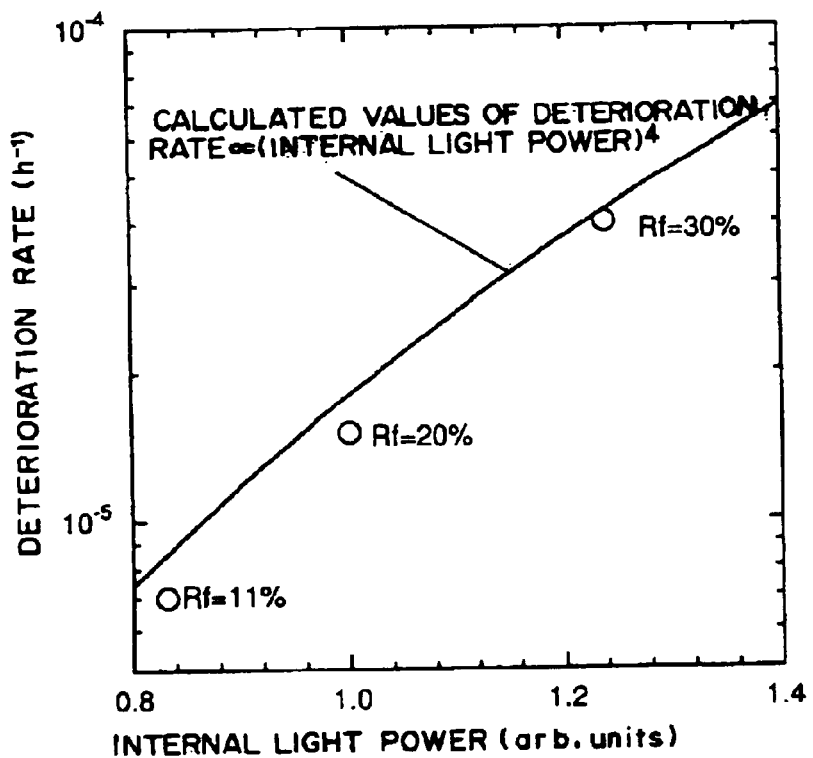
FIG. 11 is a view showing the relation between the drive current deterioration rate and the internal light power in a conventional ridge waveguide type semiconductor laser.

The relation between the drive current deterioration rate in median and the internal light density at the light radiating end face when the laser was driven under 1.8W at 25° C. in an APC mode was measured for each laser. As can be seen from FIG. 11, the drive current deterioration rate greatly increases substantially in proportion to the fourth power of the internal light density at the light radiating end face and greatly depends upon the whole internal light intensity.

Figure 12:
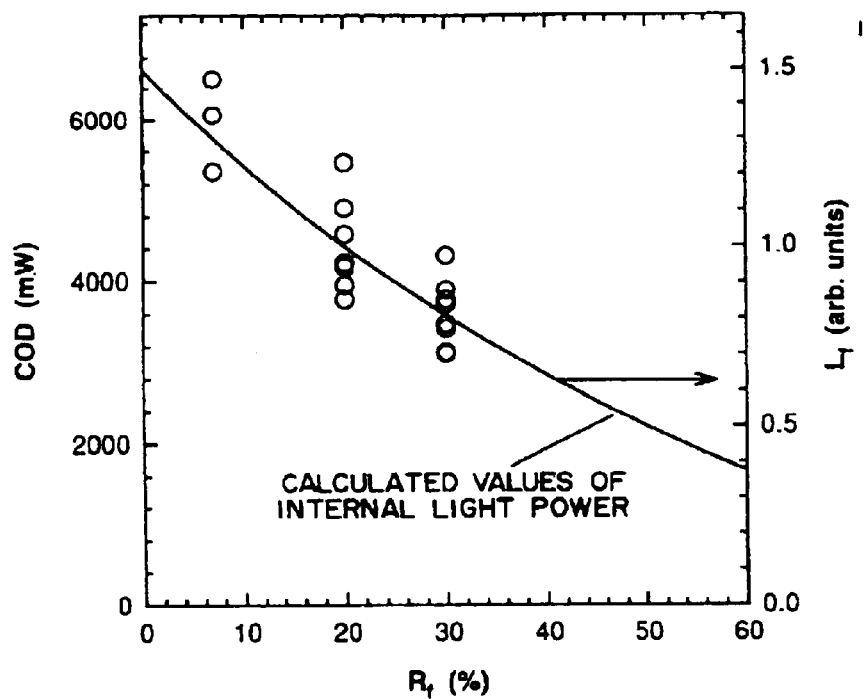
FIG. 12 is a view showing comparison of measured values of catastrophic optical damage (COD) and the calculated value of internal light power at the front end face of a conventional ridge waveguide type semiconductor laser for various reflectances of the coating applied to the front end face.

In a fourth experiment, $R_f$ dependency of the catastrophic optical damage was evaluated for laser elements which were 0.11 μm in the thickness Wg of the optical waveguide layer. As shown in FIG. 12, the catastrophic optical damage was proportional to the internal light power.

The result of the aforesaid experiments shows that with the arrangement of the present invention, though the deterioration rate depends upon the light density in the quantum well of the active layer, the catastrophic optical damage was substantially proportional to the whole internal light power.

Figure 13:
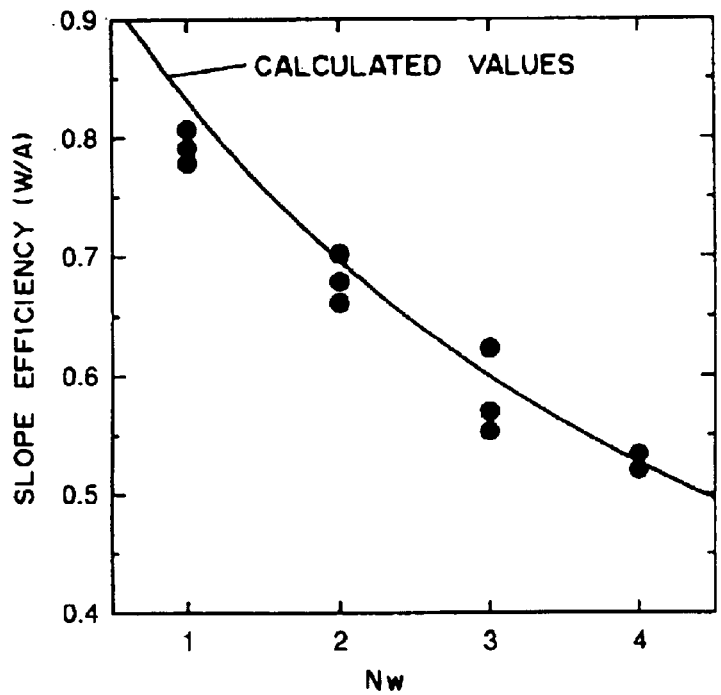
FIG. 13 is a view showing a comparison of measured relation between the number of quantum wells and the slope efficiency and theoretical relation of the same.

As a fifth example, factors which governed the internal loss ($\alpha_i$[cm$^{-1}$]) were investigated on the basis of the slope efficiency for various laser elements. The experiment was carried out by use of laser elements having an oxide film stripe structure of 50 μm width for the purpose of material evaluation. FIG. 13 shows the dependency of the slope efficiency on the number of the quantum wells Nw (Nw—1~4) with the total thickness of the active layer (including quantum wells (10 nm wide), barrier layers (undoped InGaP the same as that of the optical waveguide layers, 10 nm thick) parting the quantum wells and optical waveguide layers) fixed to 0.23 μm.

The slope efficiency is proportional to the external differential quantum efficiency ($\eta_d$) for the whole radiating light. The external differential quantum efficiency $\eta_d$ is expressed by the following formula (1).

$$\eta_i \frac{\ln\left(\frac{1}{\sqrt{R_f R_r}}\right)}{\alpha_i L + \ln\left(\frac{1}{\sqrt{R_f R_r}}\right)} \tag{1}$$

wherein $\eta_i$ represents the internal differential quantum efficiency, $R_f$ represents the reflectance of the light radiating end face, $R_r$ represents the reflectance of the rear end face, and L represents the length of the resonator. Actually, only light radiated through the front end face is measured and utilized. The slope efficiency is related to the external differential quantum efficiency $\eta_d$ as $$\frac{L_f}{L_f + L_r}\eta_d$$

from the following relation between the amount of light radiated from the front end face $L_f$ and that radiated from the read end face $L_r$.

$$\frac{L_f}{L_r} = \sqrt{\frac{R_r}{R_f}} \frac{(1-R_f)}{(1-R_r)}$$

In the case of a single-quantum well, it has been found that $\alpha_i$=2 cm$^{-1}$, and $\eta_i$=0.7 when Wg=0.11 μm from a result of measurement of resonator length dependency of the slope efficiency carried out separately. The calculated values in FIG. 13 were obtained letting $n_i$=0.7 (constant) and $a_i$=Nwx2(cm$^{-1}$) and well conform to the result of the experiment. Accordingly, the residual loss in the semiconductor laser of the present invention may be considered to be mainly governed by loss by the quantum wells themselves.

Further single quantum well laser elements (Nw=1) and double quantum well laser elements (Nw=2) which were different from each other in the thickness Wg of the optical waveguide layer were prepared and the slope efficiency of each laser element was measured. As shown in FIG. 14, the result of the measurement conformed to the calculated values in tendency that the internal loss increased in proportion to the amount of light in the quantum well. This supports that the residual loss in the semiconductor laser of the present invention is mainly governed by loss by the quantum wells themselves.

The result of the experiments shows that in the semiconductor lasers in accordance with the present invention, the deterioration mechanism and the internal loss are due to the inside of the active layer and greatly depend upon the light power in the active layer. Accordingly, these factors can be improved by making the thickness Wg of the optical waveguide layer not smaller than 0.25 µm.

Figure 16:
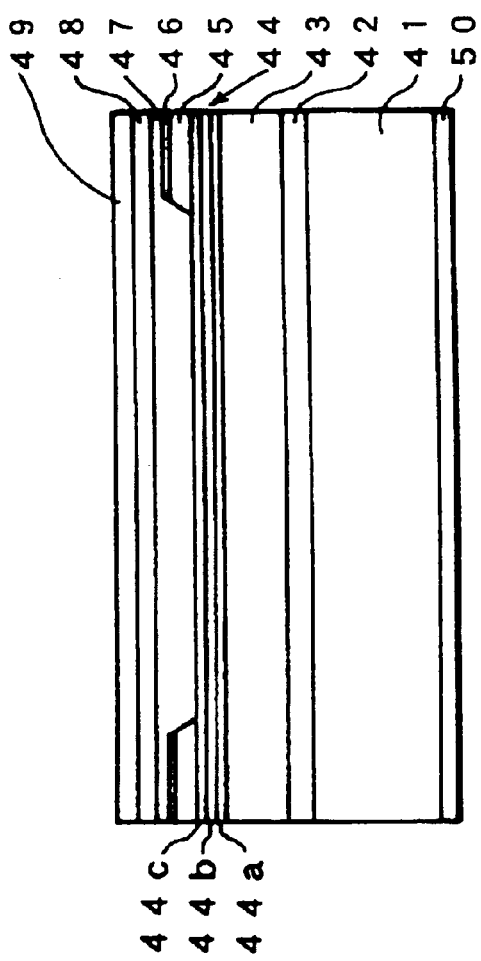
FIG. 16 is a schematic view showing the layer arrangement of a ridge waveguide type semiconductor laser in accordance with a second embodiment of the present invention.

A semiconductor laser in accordance with a second embodiment of the present invention will be described with reference to FIG. 16, hereinbelow. In FIG. 16, the semiconductor laser in accordance with the second embodiment of the present invention comprises an n-GaAs buffer layer 42 (doped with 1×10$^{18}$cm$^{-3}$ Si, 0.5 µm thick), an n-Al$_{0.55}$Ga$_{0.45}$As lower cladding layer 43 (doped with 1×10$^{18}$cm$^{-3}$ Si, 1 µm thick), an undoped SCH active layer 44, an n-Al$_{0.65}$Ga$_{0.35}$As current blocking layer 45 (doped with 1×10$^{18}$cm$^{-3}$ Si, 0.8 µm thick), an n-GaAs protective layer 46 (doped with 1×10$^{18}$ cm$^{-3}$ Si, 0.01 µm thick), a p-Al$_{0.55}$Ga$_{0.45}$As upper cladding layer 47 (doped with 1×10$^{18}$cm$^{-3}$ Zn, 1 µm thick), a p-GaAs capping layer 48 (doped with 2×10$^{19}$cm$^{-3}$ Zn, 0.3 µm thick), and a p-side electrode 49 formed one on another on one side of an n-GaAs substrate 41 (doped with 2×10$^{18}$cm$^{-3}$ Si) and an n-side electrode 50 formed on the other side of the substrate 41.

The undoped SCH active layer 44 comprises an In$_{0.48}$Ga$_{0.52}$P lower optical waveguide layer 44a (undoped, 0.25 µm in thickness Wg), an In$_{0.3}$Ga$_{0.87As0.75}$P$_{0.25}$ quantum well layer 44b (undoped, 10 nm thick) and an In$_{0.48}$Ga$_{0.52}$P upper optical waveguide layer 44c (undoped, 0.25 µm in thickness Wg).

A method manufacturing this semiconductor laser will be described, hereinbelow. In this embodiment, unlike in the first embodiment, the laser is produced by two-step low-pressure MOCVD. That is, an n-GaAs buffer layer 42, an n-Al$_{0.55}$Ga$_{0.45}$As lower cladding layer 43, an undoped SCH active layer 44, an n-Al$_{0.65}$Ga$_{0.35}$As current blocking layer and an n-GaAs protective layer 46 are first grown one on another in this order on one side of an n-GaAs substrate 41 by low-pressure MOCVD.

Then a mesa stripe channel which is 200 µm in bottom width is formed by photolithography and chemical etching by use of a 20:1:1 mixture of H$_2$SO$_4$, H$_2$O$_2$ and H$_2$O. At this time, the etching is stopped just above the In$_{0.48}$Ga$_{0.52}$P upper optical waveguide layer 44c since the undoped SCH active layer 44 comprises the In$_{0.48}$Ga$_{0.52}$P lower optical waveguide layer 44a (undoped, 0.25 µm in thickness Wg), the In$_{0.13}$Ga$_{0.87As0.75}$P$_{0.25}$ quantum well layer 44b (undoped, 10 nm thick) and the In$_{0.48}$Ga$_{0.52}$P upper optical waveguide layer 44c.

Then a p-Al$_{0.55}$Ga$_{0.45}$As upper cladding layer 47 and a p-GaAs capping layer 48 are grown in sequence by low-pressure MOCVD.

Thereafter, a p-side electrode 49 is formed, the GaAs substrate 41 is polished, an n-side electrode 50 is formed, a laser bar is cut out, the light radiating end face and the back end face are applied with optical coating films, and the laser bar is cut into a plurality of laser chips in the manner similar to that in the first 114 embodiment.

Figure 17:
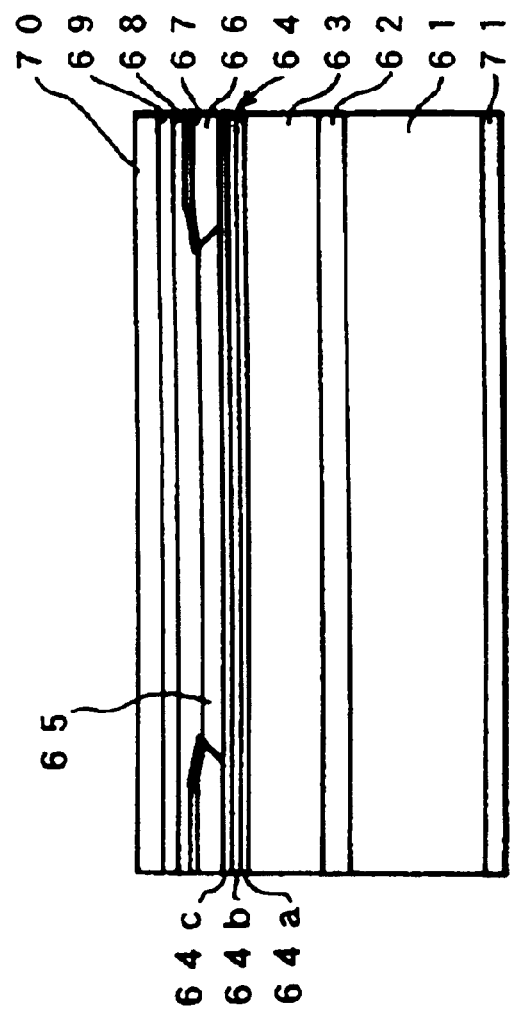
FIG. 17 is a schematic view showing the layer arrangement of a ridge waveguide type semiconductor laser in accordance with a third embodiment of the present invention.

A semiconductor laser in accordance with a third embodiment of the present invention will be described with reference to FIG. 17, hereinbelow. In FIG. 17, the semiconductor laser in accordance with the third embodiment of the present invention comprises an n-GaAs buffer layer 62 (doped with 1×10$^{18}$cm$^{-3}$ Si, 0.5 µm thick), an n-Al$_{0.6}$Ga$_{0.4}$As lower cladding layer 63 (doped with 1×10$^{18}$cm$^{-3}$Si, 1 µm thick), an undoped SCH active layer 64, an n-Al$_{0.65}$Ga$_{0.35}$As current blocking layer 66 (doped with 18×10$^{18}$cm$^{-3}$ Si, 0.8 µm thick), a p-GaAs protective layer 67 (doped with 1×10$^{18}$ cm$^{-3}$ Si, 0.01 µm thick), a p-Al$_{0.6}$Ga$_{0.4}$As first upper cladding layer 65 (doped with 1×10$^{18}$cm$^{-3}$ Zn, 1 µm thick), a p-Al$_{0.6}$Ga$_{0.4}$As second upper cladding layer 68 (doped with 1×10$^{18}$cm$^{-3}$ Zn, 1 µm thick), a p-GaAs capping layer 69 (doped with 2×10$^{19}$ cm$^{-3}$ Zn, 0.3 µm thick), and a p-side electrode 70 formed one on another on one side of an n-GaAs substrate 61 (doped with 2×10 cm Si) and an n-side electrode 71 formed on the other side of the substrate 61.

The undoped SCH active layer 64 comprises an In$_{0.48}$Ga$_{0.52}$P lower optical waveguide layer 64a (undoped, 0.25 µm in thickness Wg), an In$_{0.13}$Ga$_{0.87As0.75}$P$_{0.25}$ quantum well layer 64b (undoped, 10 nm thick) and an In$_{0.48}$Ga$_{0.52}$P upper optical waveguide layer 64c (undoped, 0.25 µm in thickness Wg).

A method manufacturing this semiconductor laser will be described, hereinbelow. In this embodiment, the laser is produced by three-step low-pressure MOCVD. That is, an n-GaAs buffer layer 62, an n-Al$_{0.55}$Ga$_{0.45}$As lower cladding layer 63, an undoped SCH active layer 64, a p-Al$_{0.6}$Ga$_{0.4}$As first upper cladding layer 65 and a p-GaAs protective layer 67 are grown one on another in this order on one side of an n-GaAs substrate 41 by first low-pressure MOCVD.

Thereafter, a SiO$_2$ film 0.25 µm thick is formed by plasma CVD, and a stripe-like SiO$_2$ mask 200 µm wide is formed by photolithography and etching by use of dilute HF.

Then an n-Al$_{0.65}$Ga$_{0.35}$As current blocking layer 66 and a p-GaAs protective layer 67 are grown by second low-pressure MOCVD. At this time, though polycrystal grows also on the SiO$_2$ mask, it can be removed by next etching.

Then short etching by use of a mixture of H$_2$SO$_4$, H$_2$O$_2$ and H$_2$O is carried out and the SiO$_2$ mask is removed by dilute HF.

After etching the p-GaAs protective layer 67 for a short time with a mixture of H$_2$SO$_4$, H$_2$O$_2$ and H$_2$O, a p-Al$_{0.6}$Ga$_{0.4}$As second upper cladding layer 68 and a p-GaAs capping layer 69 are grown by third low-pressure MOCVD.

Thereafter, a p-side electrode 70 is formed, the GaAs substrate 61 is polished, an n-side electrode 71 is formed, a laser bar is cut out, the light radiating end face and the back end face are applied with optical coating films, and the laser bar is cut into a plurality of laser chips in the manner similar to that in the first embodiment.

Though the present invention is described above in conjunction with a broad stripe semiconductor laser having a stripe 200 µm wide, the present invention can also be applied to multiple transverse mode semiconductor lasers having a broad stripe of various widths or a single transverse mode semiconductor lasers which are not larger than about 6 µm in width of the stripe.

The active layer which includes at least a quantum well layer and upper and lower optical waveguide layers has only to be of $In_xGa_{1-x}As_yP_{1-y}$ ($0 \leq x \leq 1$, $0 \leq y \leq 1$), and a strain layer which is not lattice-matched with the substrate may be partly used. Further the upper and lower optical waveguide layers on opposite sides of the quantum well layer may be of different thicknesses. In this case, the quantum well layer is shifted from a position in which the light intensity is maximized and the optical confinement factor Γ is reduced, and accordingly, the light density in the quantum well can be reduced when the thicker one of the optical waveguide layers is not smaller than 0.25 µm.

What is claimed is:

1. A semiconductor laser comprising an active region which includes at least a quantum well layer and upper and lower optical waveguide layers on opposite sides of the at least a quantum well layer, the quantum well layer, the upper optical waveguide layer, and the lower optical waveguide layer each being formed of $In_xGa_{1-x}As_yP_{1-y}$ ($0x \leq 1$, $0 \leq y \leq 1$), and upper and lower cladding layers formed of AlGaAs on opposite sides of the active region, wherein the improvement comprises that:

said upper optical waveguide layer is not smaller than 0.25 µm in thickness, and a part of the upper cladding layer on the upper optical waveguide layer is selectively removed up to the interface of the upper cladding layer and the upper optical waveguide layer.

2. A semiconductor laser as defined in claim 1 in which the structure where said part of the upper cladding layer on the upper optical waveguide layer which is selectively removed up to the interface of the upper cladding layer and the upper optical waveguide layer forms a ridge structure.

3. A semiconductor laser as defined in claim 1, wherein the upper and lower optical waveguide layers on opposite sides of the quantum well layer are different thicknesses.

4. A semiconductor laser as defined in claim 1, wherein a thickness of the upper cladding layer is greater than zero, but less than or equal to 1 µm.

5. A semiconductor laser as defined in claim 4, wherein a thickness of the upper cladding layer is greater than zero, but less than 1 µm.

6. A semiconductor laser as defined in claim 1, wherein said at least a quantum well layer is one quantum well layer.

7. A semiconductor laser as defined in claim 1, wherein a resonator of said semiconductor laser is formed as a stripe, boundaries of the interface between said upper cladding layer and said upper optical waveguide layer defining a stripe width of said resonator, said part of the upper cladding layer on the upper optical waveguide layer which is selectively removed defining a lateral edge of the stripe.

8. A semiconductor laser as defined in claim 7, wherein said part of the upper cladding layer on the upper optical waveguide layer which is selectively removed is outside said stripe, said upper cladding layer forming a mesa stripe structure and said semiconductor laser being of a ridge waveguide type.

9. A semiconductor laser comprising an active region which includes at least one quantum well layer and upper and lower optical waveguide layers on opposite sides of said at least one quantum well layer, the quantum well layer, the upper optical waveguide layer, and the lower optical waveguide layer each being formed of $In_xGa_{1-x}As_y$ ($0 \leq x \leq 1$, $0 \leq y \leq 1$), and upper and lower cladding layers formed of AlGaAs on opposite sides of the active region, wherein the improvement comprises that:

said upper optical waveguide layer is not smaller than 0.25 µm in thickness, a current blocking layer interposed between portions of the upper cladding layer and the upper optical waveguide layer, said current blocking layer being on the upper optical waveguide layer, and the portions of the upper cladding layer and the upper optical waveguide layer having the current blocking layer interposed being along opposite lateral edges of said semiconductor laser, and an interface of the upper cladding layer and the upper optical waveguide layer, said interface being adjacent to said portions of the upper cladding layer and the upper optical waveguide layer having the current blocking layer interposed.

10. A semiconductor laser as defined in claim 9, wherein said current blocking layer is AlGaAs, having an opposite conductivity type to said upper cladding layer.

11. A semiconductor laser as defined in claim 9, wherein the upper and lower optical waveguide layers on opposite sides of said at least one quantum well layer are different thicknesses.

12. A semiconductor laser as defined in claim 9, wherein a thickness of the upper cladding layer is greater than zero, but less than or equal to 1 µm.

13. A semiconductor laser as defined by claim 12, wherein a thickness of the upper cladding layer is greater than zero, but less than 1 µm.

14. A semiconductor laser as defined in claim 9, wherein said at least one quantum well layer is one quantum well layer.

15. A semiconductor laser as defined in 9, wherein a resonator of said semiconductor laser is formed as a stripe, boundaries of the interface between said upper cladding layer and said upper optical waveguide layer defining a stripe width of said resonator, said portions of the upper cladding layer and the upper optical waveguide layer having the current blocking layer interposed defining lateral edges of the stripe.

16. A semiconductor laser as defined in 15, wherein said portions of the upper cladding layer and the upper optical waveguide layer having the current blocking layer interposed form a mesa stripe channel, said interface of the upper cladding layer and the upper optical waveguide layer being inside said mesa stripe channel.

* * * * *